United States Patent
Sakata et al.

(10) Patent No.: US 7,633,217 B2
(45) Date of Patent: Dec. 15, 2009

(54) WHITE-LIGHT LIGHT EMITTING DIODE DEVICE

(75) Inventors: Shin-ichi Sakata, Ube (JP); Atsuyuki Mitani, Ube (JP); Itsuhiro Fujii, Ube (JP)

(73) Assignee: Ube Industries, Ltd. (JP)

( * ) Notice: Subject to any disclaimer, the term of this patent is extended or adjusted under 35 U.S.C. 154(b) by 186 days.

(21) Appl. No.: 10/571,223

(22) PCT Filed: Jun. 16, 2005

(86) PCT No.: PCT/JP2005/011480

§ 371 (c)(1),
(2), (4) Date: Mar. 9, 2006

(87) PCT Pub. No.: WO2006/001316

PCT Pub. Date: Jan. 5, 2006

(65) Prior Publication Data

US 2006/0250069 A1    Nov. 9, 2006

(30) Foreign Application Priority Data

Jun. 24, 2004   (JP) ............................. 2004-186175

(51) Int. Cl.
*H01J 1/62* (2006.01)
*H01J 63/04* (2006.01)

(52) U.S. Cl. .................. 313/501; 313/498; 313/499; 313/502; 313/503; 313/512; 257/99; 501/153

(58) Field of Classification Search ......... 313/498–512; 257/99; 501/153
See application file for complete search history.

(56) References Cited

U.S. PATENT DOCUMENTS

| 5,484,752 | A |   | 1/1996  | Waku et al. |
| 5,569,547 | A |   | 10/1996 | Waku et al. |
| 5,902,763 | A |   | 5/1999  | Waku et al. |
| 5,981,415 | A | * | 11/1999 | Waku et al. ................... 501/80 |
| 2004/0104672 | A1 | * | 6/2004 | Shiang et al. ............... 313/506 |

FOREIGN PATENT DOCUMENTS

| JP | 07-149597 A    | 6/1995  |
| JP | 07-187893 A    | 7/1995  |
| JP | 08-081257 A    | 3/1996  |
| JP | 08-253389 A    | 10/1996 |
| JP | 08-253390 A    | 10/1996 |
| JP | 09-067194 A    | 3/1997  |
| JP | 2000-208815 A  | 7/2000  |
| JP | 2001-185764 A  | 7/2001  |
| JP | 2002-141559 A  | 5/2002  |

* cited by examiner

Primary Examiner—Nimeshkumar D. Patel
Assistant Examiner—Thomas A Hollweg
(74) Attorney, Agent, or Firm—DLA Piper LLP (US)

(57) ABSTRACT

A white-light light emitting diode device comprising a light emitting diode element capable of emitting violet light at a wavelength of 400 to 419 nm and a ceramic composite material, wherein the ceramic composite material is a solidified body in which a cerium-activated $Y_3Al_5O_{12}$ ($Y_3Al_5O_{12}$:Ce) crystal and an α-type aluminum oxide ($Al_2O_3$) crystal are continuously and three-dimensionally entangled with each other, the solidified body having not only a photoluminescent property of wavelength-converting a part of the violet light into yellow light but also a function of transmitting a part of the violet light, and the violet light transmitted through the ceramic composite material and yellow light resulting from wavelength conversion by the ceramic composite material are mixed to emit pseudo-white light.

6 Claims, 7 Drawing Sheets

US 7,633,217 B2

WHITE-LIGHT LIGHT EMITTING DIODE DEVICE

TECHNICAL FIELD

This disclosure relates to a white-light light emitting diode device usable in a display, in lighting, as a backlight source and the like. More specifically, the disclosure relates to a white-light light emitting diode device capable of converting a part of the irradiation light into light at a wavelength different from the irradiation light and, at the same time, mixing the converted light with the unconverted irradiation light to cause conversion into light having a color tone different from that of the irradiation light.

BACKGROUND ART

With recent implementation of a blue-light light emitting diode in practical use, studies are being aggressively made to develop a white-light light emitting diode device using this diode as the light emission source. The white-light light emitting diode device is greatly advantageous in that the power consumption is low and the life is long as compared with existing white light sources, and the demand therefore is expected to rapidly expand in the future. As for the method of converting blue light of the blue-light light emitting diode into white light, a method described, for example, in Japanese Unexamined Patent Publication (Kokai) No. 2000-208815 is most commonly employed, where a coating layer capable of absorbing a part of blue light and emitting yellow light nearly in a complimentary color relationship with the blue light and a mold layer for mixing blue light of the light source with yellow light from the coating layer is provided at the front of a light emitting element. The coating layer employed in the conventional technique is provided by coating a mixture of cerium-activated YAG (YAG means yttrium-aluminum-garnet; hereinafter the activated YAG is simply referred to as "YAG:Ce") powder and epoxy resin on a light emitting element (see, Kokai No. 2000-208815). The light of the light emitting diode used in this technique is at a wavelength in the vicinity of 460 nm. This wavelength is employed because the light emission efficiency of the cerium-activated YAG becomes high in this wavelength region. However, the color of the YAG:Ce photoluminescence is present approximately at x=0.41 and y=0.56 in the CIE chromaticity coordinates (1964) and when this is mixed with the color of excited light at 460 nm, the color produced is not white but becomes white mixed with green-blue color. In order to solve this problem of poor color tone, for example, a method of changing the peak wavelength of YAG:Ce photoluminescence from 530 nm to a longer wavelength is used. However, this method is disadvantageous in that the kinds of elements added are increased and, therefore, not only the adjustment of the composition or the production procedure becomes complicated but also a product having a uniform composition can be hard to obtain.

Accordingly, another method for solving the problem may be considered where a violet color which is a preferred complimentary color of the photoluminescent color of the YAG:Ce phosphor powder is employed as the excitation wavelength. However, use of a violet color causes extreme reduction in the light emission efficiency of the YAG phosphor and, as the emission of a yellow color used for color mixing decreases, a white color light can be hardly obtained. When the YAG:Ce phosphor powder is mixed in a large amount in the coating phase so as to compensate for the reduction of light emission efficiency, the transmission of light is seriously decreased and it is difficult to obtain a bright white-light light emitting diode.

It could therefore be advantageous to provide a technique capable of fabricating a white-light light emitting device assured of good color tinge, without requiring compositional adjustment of the color tone of the $Y_3Al_5O_{12}$:Ce phase by a violet color which is in an exactly complementary color relationship with photoluminescence of a ceramic composite material for color conversion comprising a cerium-activated $Y_3Al_5O_{12}$.

SUMMARY

We provide a method of fabricating a white-light light emitting diode device by using a blue-light light emitting diode chip and a ceramic composite material for light conversion having a structure such that a cerium-activated $Y_3Al_5O_{12}$ (hereinafter simply referred to as $Y_3Al_5O_{12}$:Ce) phase and an $Al_2O_3$ phase are three-dimensionally entangled. More specifically, this ceramic composite material for light conversion is one material, but comprises an $Al_2O_3$ phase capable of transmitting blue light as well as a $Y_3Al_5O_{12}$:Ce phase capable of absorbing blue light to emit yellow light, where high color mixing performance is ensured by virtue of three-dimensional and complicated entangling of these phases, each phase has high light transmittance, and the heat resistance are excellent. We further studied the ceramic composite material for light conversion and, as a result, found that this material has a peculiar excitation spectrum and the excitation can be effected even in the wavelength range where a conventional coating phase prepared by dispersing YAG:Ce in a resin cannot cause excitation.

That is, we provide a white-light light emitting diode device comprising a light emitting diode element capable of emitting violet light at a wavelength of 400 to 419 nm (preferably violet light having a peak wavelength between 400 and 419 nm) and a ceramic composite material, wherein the ceramic composite material is a solidified body in which a cerium-activated $Y_3Al_5O_{12}$ crystal and an x-type aluminum oxide ($Al_2O_3$) crystal are continuously and three-dimensionally entangled with each other, the solidified body having not only a photoluminescent property of wavelength-converting a part of the violet light into yellow light but also a function of transmitting a part of the violet light, and the violet light transmitted through the ceramic composite material and yellow light resulting from wavelength conversion by the ceramic composite material are mixed to emit pseudo-white light.

The ceramic composite material is preferably obtained by a unidirectional solidification method.

In the ceramic composite material, the cerium-activated $Y_3Al_5O_{12}$ is preferably represented by the formula: $(Y_{1-x}Ce_x)_3 Al_5O_{12}$ (wherein x is in the range from 0.01 to 0.2).

Furthermore, we provide the above-described white-light light emitting diode device, wherein the excitation spectrum corresponding to the photoluminescence at 530 nm of the ceramic composite material has a peak in the region of 400 to 520 nm and the peak width at half height of the peak is 65 nm or more.

The ceramic composite material may have, for example, a plate-like or block-like shape.

By combining a light emitting diode element capable of emitting violet light at a wavelength of 400 to 419 nm with a ceramic composite material which is a solidified body where a cerium-activated $Y_3Al_5O_{12}$ crystal and an α-type aluminum oxide ($Al_2O_3$) crystal are continuously and three-dimensionally entangled with each other, white light with good color tone unobtainable by a phosphor material comprising a resin having dispersed therein YAG:Ce can be obtained by the mixing of two lights in an exactly complementary color relationship, without requiring compositional adjustment of the color tone of the $Y_3Al_5O_{12}$:Ce phase.

DETAILED DESCRIPTION

Figure 5A:
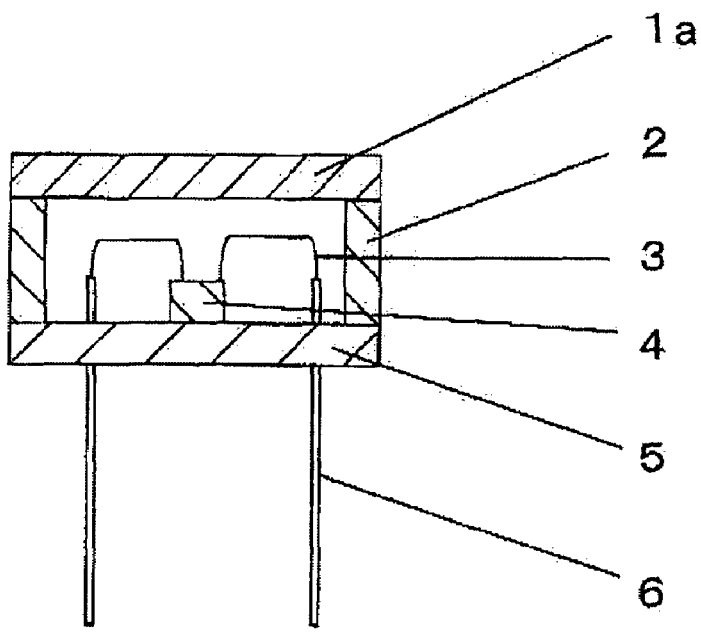
FIG. 5A is a construction view showing one embodiment of the white-light light emitting diode device.
Figure 5B:
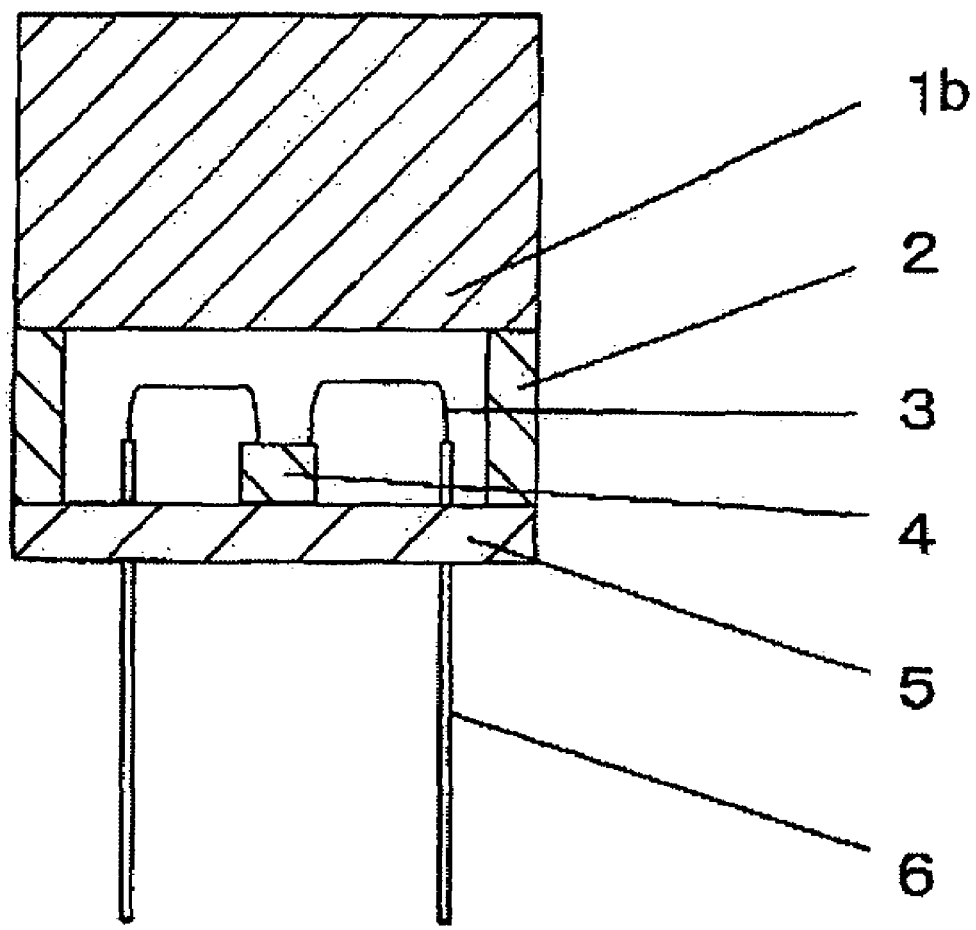
FIG. 5B is another construction view showing an aspect of the white-light light emitting diode device.

The white-light light emitting diode device comprises a combination of a violet-light light emitting diode element and a ceramic composite material and may be constituted, for example, as shown in FIGS. 5A and 5B, such that a ceramic composite material plate is arranged to cover a light emitting element. In FIG. 5A, $1a$ is a plate-like ceramic composite material for light conversion, 2 is a container, 3 is a gold wire, 4 is a light emitting element, 5 is a table with electrodes; and 6 is an electrode. In FIG. 5B, $1b$ is a block-like ceramic composite material for light conversion.

The violet-light light emitting diode element used as the light source of the white-light light emitting device is a light emitting diode element capable of emitting at least violet light at a wavelength of 400 to 419 nm, and light at other wavelengths may be mixed therewith. As for the light emitting diode chip, for example, an InGaN-based light emitting diode may be used and this diode itself is commercially available. Other than this, any light source may be used as long as it emits violet light at 400 to 419 nm.

The ceramic composite material for use in the white-light light emitting diode device is a solidified body where a cerium-activated $Y_3Al_5O_{12}$ ($Y_3Al_5O_{12}$:Ce) crystal and an α-type aluminum oxide ($Al_2O_3$) crystal are continuously and three-dimensionally entangled with each other, and this ceramic composite material has a photoluminescent property of wavelength-converting a part of the violet light into yellow light and at the same time, has a function of transmitting a part of the violet light.

Figure 1:
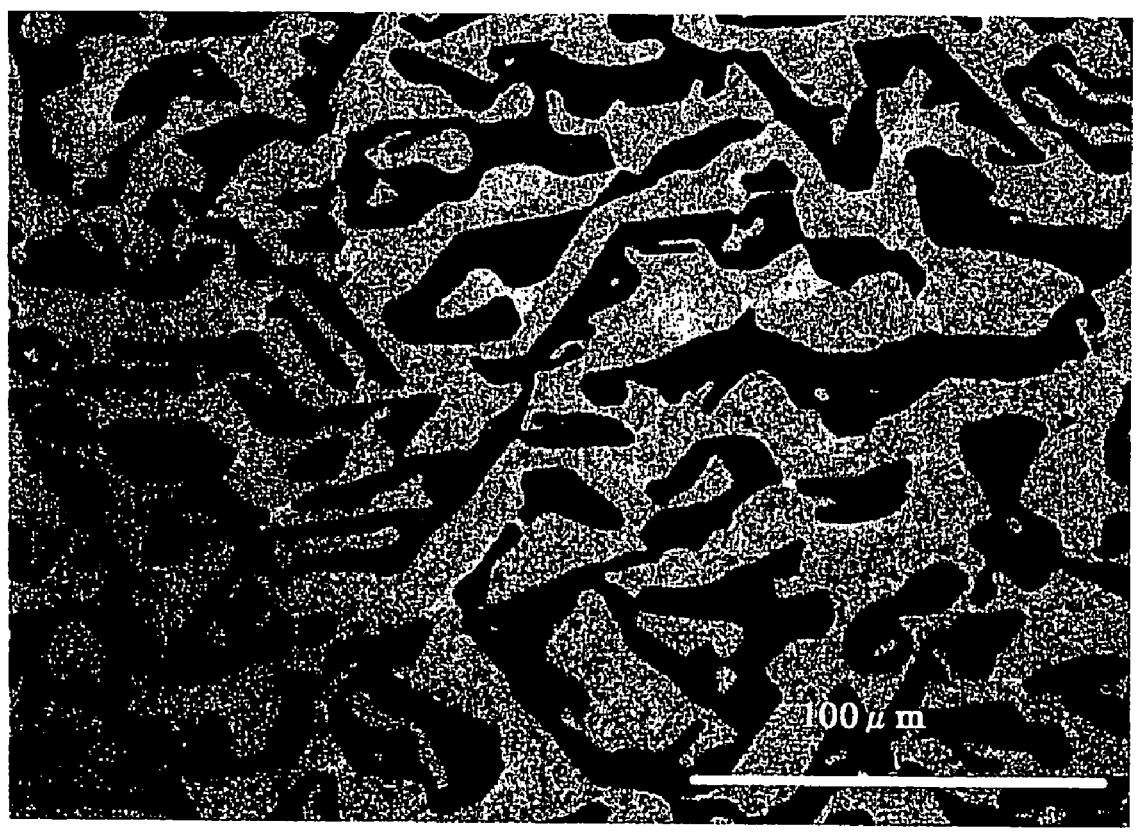
FIG. 1 is an electron microphotograph showing the texture structure of the ceramic composite material obtained in Example 1.

More specifically, the ceramic composite material for use in the white-light light emitting diode device comprises a cerium-activated $Y_3Al_5O_{12}$ which is a phosphor crystal having a photoluminescent property of wavelength-converting at least violet light at 400 to 419 nm into yellow light, and an α-type aluminum oxide ($Al_2O_3$) which is a light-transparent crystal having a function of transmitting the violet light. FIG. 1 is an electron microphotograph showing the texture in one embodiment of the ceramic composite material. The white portion is the $Y_3Al_5O_{12}$:Ce phase and the black portion is the $Al_2O_3$ phase. This solidified body is free from a colony or a grain boundary phase and has a uniform texture without the presence of air bubbles or voids.

The cerium-activated $Y_3Al_5O_{12}$ crystal is represented by the formula: $(Y_{1-x}Ce_x)_3Al_5O_{12}$. x is preferably in the range from 0.01 to 0.2. When x is in this range, high photoluminescence intensity and less production of a heterogeneous phase are ensured and a ceramic composite material having high photoluminescence intensity can be obtained.

By virtue of combining such a ceramic composite material with a diode element of emitting violet light, the white-light light emitting diode device can emit pseudo-white light resulting from mixing of violet light transmitted through the ceramic composite material and yellow light resulting from wavelength conversion by the ceramic composite material. In particular, according to the white-light light emitting diode device, white light with good color tone unobtainable by a phosphor powder prepared by dispersing a cerium-activated YAG (YAG:Ce) powder can be obtained by the mixing of two lights in the exactly complementary color relationship.

The excitation spectrum corresponding to photoluminescence at 530 nm of the ceramic composite material for use has a peak in the region of 400 to 520 nm, and the peak width at half height of the peak which is unobtainable by a phosphor powder prepared by dispersing a cerium-activated YAG (YAG:Ce) powder, is 65 nm or more. This size of the peak broadening enables to use violet light in the complementary color relationship with yellow photoluminescence for the light source.

The excitation spectrum of the ceramic composite material is different from the excitation spectrum of the phosphor powder. Compared with the excitation spectrum corresponding to photoluminescence at 530 nm of a sample obtained by using YAG:Ce powder and α-$Al_2O_3$ powder having the same composition as in the ceramic composite material comprising $Al_2O_3/Y_3Al_5O_{12}$:Ce and mixing these powders at the same volume ratio as in the ceramic composite material, the ceramic composite material exhibits high excitation intensity in the region from 400 to 520 nm and at the same time, the peaks appearing in the regions from 300 to 400 nm and from 400 to 520 nm are broad. By virtue of such characteristics, the excitation in the vicinity of 410 nm corresponding to violet light, which is important at the fabrication of a white-light light emitting diode, is intensified. The appearance of this excitation spectrum is not yet been elucidated in detail but it is considered to occur because the crystal field of Ce in the $Al_2O_3/Y_3Al_5O_{12}$:Ce ceramic composite material for light conversion differs from the crystal field of Ce in the powder. As is clarified in the article disclosed in *Journal of Material Science*, 33, page 1217 (1998), the junction at the interface in $Al_2O_3/Y_3Al_5O_{12}$ is in the atomic level and an interphase boundary having atomic disorder is not present on the interface. At such an interface, the lattice mismatch is relieved and a local strain of the atomic position is generated. Also, Ce as the light emission source is considered to be present in the vicinity of the interface in such an atomic level junction. Accordingly, the crystal field in the vicinity of Ce differs from the state in the powder and as a result of change in the crystal field in the vicinity of Ce, the wavelength excited is changed and broadening of the excitation spectrum occurs.

Although these facts remain a matter for speculation, it is a fact that the measured excitation spectrum of the $Al_2O_3$/$Y_3Al_5O_{12}$:Ce ceramic composite material greatly differs from the excitation spectrum obtained in normal YAG:Ce, and the $Y_3Al_5O_{12}$:Ce in the ceramic composite material exhibits photoluminescent characteristics utterly different from the normal powder YAG:Ce. The $Al_2O_3$/$Y_3Al_5O_{12}$ ceramic composite material comprises a $Y_3Al_5O_{12}$ phase capable of providing a Ce environment different from that in the powder YAG:Ce, and an $Al_2O_3$ phase joined thereto in an atomic level, and by virtue of such a constitution, the ceramic composite material is considered to reveal specific properties.

In the white-light light emitting diode device violet light is used for the light source. The resin material is readily deteriorated by light at a short wavelength near ultraviolet, and the conventional white-light light emitting diode device using a phosphor powder mixed in a resin has a problem that deterioration occurs. However, in the white-light light emitting diode device, as a ceramic composite material is used, the deterioration does not occur and the combination with violet light can be realized.

The cerium-activated $Y_3Al_5O_{12}$ constituting at least one phase of the ceramic composite material for use in the white-light light emitting element can be obtained by adding an activating element to a metal oxide or a complex oxide.

The ceramic composite material is the same as the ceramic composite material previously disclosed by the applicant (assignee) in, for example, Japanese Unexamined Patent Publication (Kokai) Nos. 7-149597, 7-187893, 8-81257, 8-253389, 8-253390 and 9-67194 and their corresponding U.S. patent applications (U.S. Pat. Nos. 5,569,547, 5,484,752 and 5,902,763), except that one phase is a phosphor crystal, and can be produced by the production method disclosed in these applications (patents). The contents disclosed in these applications or patents are incorporated herein by reference.

The ceramic composite material for use in the white-light light emitting element is prepared through melting of raw material oxides and then solidification. The solidified body may be obtained, for example, by a simple and easy method of cooling and solidifying the melt charged into a crucible kept at a predetermined temperature, while controlling the cooling temperature, but a solidified body produced by a unidirectional solidification method is most preferred.

The production method of the ceramic composite material is described below. $\alpha$-$Al_2O_3$, $Y_2O_3$ and $CeO_2$ are mixed at a desired component ratio to prepare a mixed powder. In the case of mixing only $\alpha$-$Al_2O_3$ and $Y_2O_3$, the optimal compositional ratio is 82:18 in terms of the molar ratio. In the case of adding $CeO_2$, the component ratio of $Al_2O_3$, $Y_2O_3$ and $CeO_2$ is determined by the back calculation from the Ce substitution amount based on the $Y_3Al_5O_{12}$ finally produced. The mixing method is not particularly limited and either a dry mixing method or a wet mixing method may be employed. Subsequently, the mixed powder is heated and melted at a temperature of causing the charged raw materials to melt by using a known melting furnace such as arc melting furnace. For example, in the case of $Al_2O_3$ and $Y_2O_3$, the mixed powder is heated and melted at 1,900 to 2,000° C.

The obtained melt is as-is charged into a crucible and subjected to unidirectional solidification. Alternatively, after the melt is once solidified, the solidified material is ground, the ground product is charged into a crucible and again heated and melted, and the crucible containing the resulting molten liquid is withdrawn from the heating zone of the melting furnace, thereby performing unidirectional solidification. The unidirectional solidification of the melt may be performed under atmospheric pressure but, to obtain a material with fewer defects in the crystal, this is preferably performed under a pressure of 4,000 Pa or less, more preferably 0.13 Pa ($10^{-3}$ Torr) or less.

The withdrawing rate of the crucible from the heating zone, that is, the solidified rate of the melt, is set to an appropriate value according to the melt composition and melting conditions but is usually 50 mm/hour or less, preferably from 1 to 20 mm/hour.

With respect to the apparatus used for the unidirectional solidification, an apparatus which is itself known may be used, where a crucible is vertically movably housed in a cylindrical container disposed in the vertical direction, an induction coil for heating is fixed to the outside of the cylindrical container at the center part, and a vacuum pump for depressurizing the space in the container is disposed.

The resulting solidified body is cut into a necessary shape such as block, plate or disc to prepare a ceramic composite material plate and combined with a violet-light light emitting diode element, whereby the white-light light emitting diode device as shown in FIG. 5 can be obtained. Unlike the conventional coating layer using a phosphor powder, this ceramic composite material such as plate does not require a resin, and a white-light light emitting diode device can be obtained by combining it with a light emitting diode element.

Figure 6:
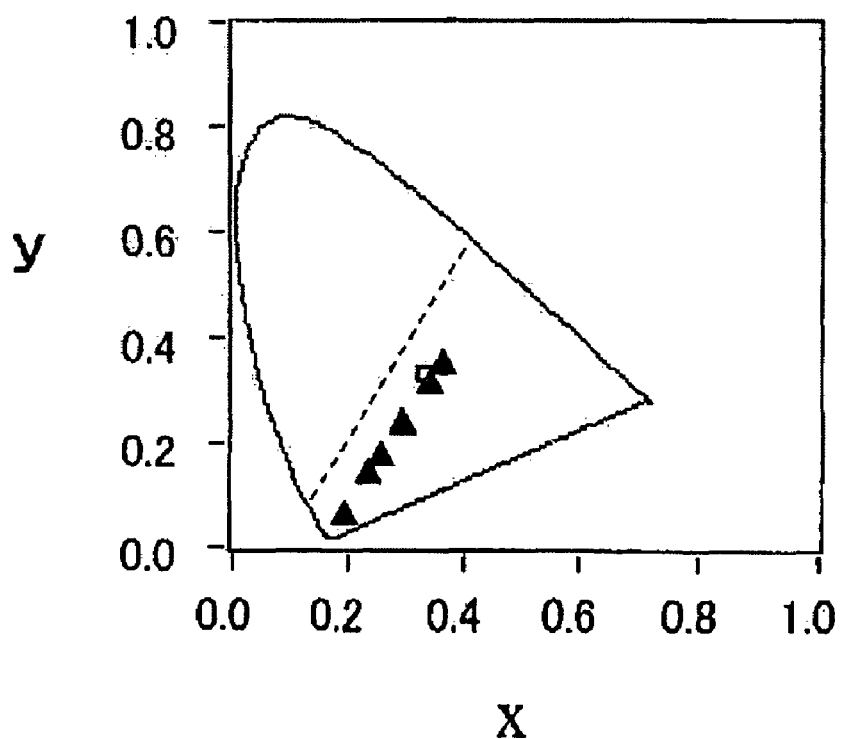
FIG. 6 is a view showing the CIE chromaticity coordinates of the white light obtained by the white-light light emitting diode device of Example 5.

FIG. 6 shows an example of the color of the white-light light emitting diode device produced by using a ceramic composite material varied in the thickness. In the white-light light emitting diode device, white light with good color tone unobtainable by a phosphor material comprising a resin having dispersed therein a YAG:Ce powder can be obtained without requiring to compositionally adjust the color tone of the $Y_3Al_5O_{12}$:Ce phase. The yellow color obtained, from the ceramic composite material has coordinates of x=0.46 and y=0.52 in the GTE chromaticity coordinates. In FIG. 6, the square indicates the position at x=0.33 and y=0.33 and this is a white position. In the white-light light emitting diode device the color of the light emitting diode can be changed by the thickness of the ceramic composite material for color conversion and the color can be adjusted to nearly the position of square in FIG. 6, so that good white color can be obtained.

The range of white color is, in the CIE chromaticity coordinates (1964), preferably the range surrounded by (0.29, 0.2), (0.48, 0.41), (0.415, 0.445) and (0.26, 0.275) in terms of (x, y). The thickness of the element giving color in this range may vary depending on the concentration of Ce added but is from 0.2 to 1.3 mm.

EXAMPLES

Selected details of the disclosure are described in greater detail below by referring to specific examples.

Example 1

An $\alpha$-$Al_2O_3$ powder (purity: 99.99%), a $Y_2O_3$ powder (purity: 99.999%) and a $CeO_2$ powder (purity: 99.99%) were used as raw materials. These powders were weighed so that the value of x in the formula $(Y_{1-x}Ce_x)_3Al_5O_{12}$ of the $Y_3Al_5O_{12}$ crystal in the ceramic composite material had the composition shown in Table 1, and then the powders were wet-mixed, in ethanol, by a ball mill for 16 hours. Thereafter, the ethanol was removed by using an evaporator to obtain a raw material powder. This raw material powder was preliminarily melted in a vacuum furnace and used as a raw material for unidirectional solidification.

TABLE 1

| Composition | Molar Ratio | | | |
| --- | --- | --- | --- | --- |
| | X | $Al_2O_3$ | $Y_2O_3$ | $CeO_2$ |
| Example 1 | 0.01 | 0.8165 | 0.1798 | 0.0036 |
| Example 2 | 0.03 | 0.8136 | 0.1756 | 0.0109 |
| Example 3 | 0.06 | 0.8092 | 0.1692 | 0.0216 |
| Example 4 | 0.1 | 0.8034 | 0.1608 | 0.0357 |

The obtained raw material was then charged as-is into a molybdenum crucible and, after setting the crucible in a unidirectional solidification apparatus, melted under a pressure of $1.33 \times 10^{-3}$ Pa ($10^{-5}$ Torr). In the same atmosphere, the crucible was moved down at a speed of 5 mm/hour, thereby obtaining a solidified body. This solidified body was tinged with a yellow color. As a result of observation by an electron microscope, this solidified body was found to be free from a colony or a grain-boundary phase and have a uniform texture without the presence of air bubbles or voids. FIG. 1 shows a scanning electron microphotograph of the solidified body obtained. Also, when phase identification was performed by using an X-ray, $CeAl_{11}O_{18}$ was observed but the abundance thereof was very small.

Figure 2:
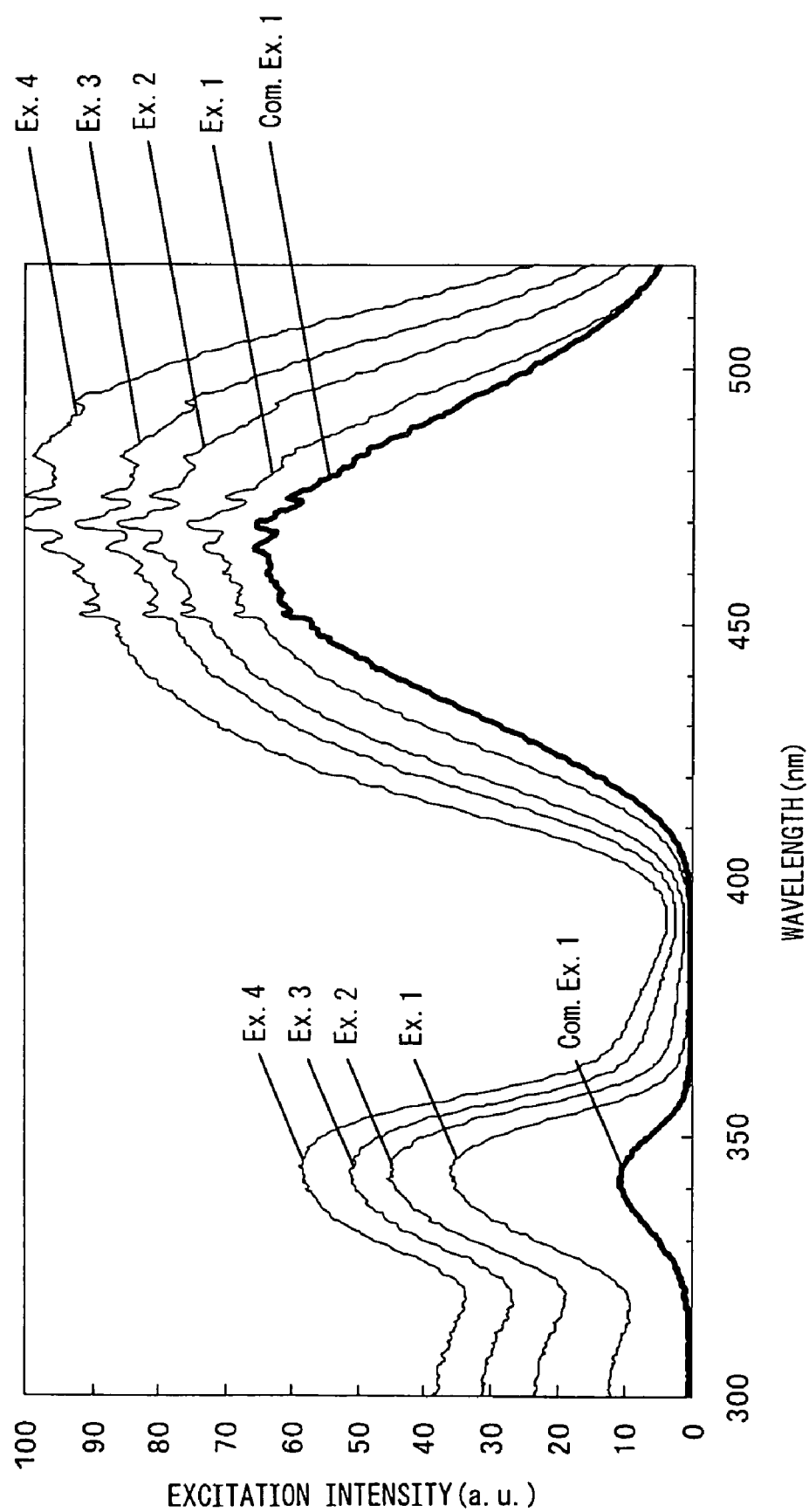
FIG. 2 shows excitation spectra with respect to 530 nm of the ceramic composite materials obtained in Examples and Comparative Example.

A disc having a diameter of 20 mm and a thickness of 0.2 mm was cut out from the obtained ingot of ceramic composite material and used as a sample for the measurement of excitation spectrum. The excitation spectrum with respect to 530 nm was measured by using FP-777 manufactured by JASCO Corp. FIG. 2 shows the measurement result. The presence of high excitation light can be confirmed also in the vicinity of 410 nm corresponding to violet light. Furthermore, the presence of a high excitation peak can be confirmed in the vicinity of 340 nm.

Examples 2 to 4

Each ceramic composite body was produced in the same manner as in Example 1 except for adjusting the raw materials so that x in the formula $(Y_{1-x}Ce_x)_3Al_5O_{12}$ of the $Y_3Al_5O_{12}$ crystal in the ceramic composite material could take the value shown in Table 1. As a result of observation by an electron microscope, each solidified body was found to be free from a colony or a grain-boundary phase and have a uniform texture without air bubbles or voids. Also, when phase identification was performed by using an X-ray, $CeAl_{11}O_{18}$ was observed but the abundance thereof was very small. FIG. 2 shows the measurement result of the excitation spectrum with respect to 530 mm of each ceramic composite body obtained. The presence of a high excitation peak can be confirmed also in the vicinity of 410 nm corresponding to violet light. Furthermore, the presence of a high excitation peak can be confirmed also in the vicinity of 340 nm.

Comparative Example 1

A YAG:Ce powder having the same composition as in Example 2 was produced. $Al_2O_3$ (99.99%), $Y_2O_3$ (99.999%) and $CeO_2$ (purity: 99.99%) each in the powder form were mixed by the method described in Example 1 and dried to obtain a raw material. Thereto, 5 parts by weight of barium fluoride ($BaF_2$) was mixed as a flux per 100 parts by weight of the raw material, and the mixture was charged into an alumina crucible and fired at 1,600° C. for 1 hour in air. After the crucible was returned to room temperature, the sample was taken out therefrom and washed with a nitric acid solution to remove the flux. The thus-obtained Ce-activated YAG powder and an $\alpha$-$Al_2O_3$ powder were weighted to give the same volume ratio as in Example 2 and thoroughly mixed in an agate mortar. The powder obtained was subjected to measurement of the excitation spectrum corresponding to the photoluminescence at 530 mm by the same method as in Example 1. FIG. 2 shows the measurement result by a heavy line.

As can be seen from the FIG. 2, the phosphor material of YAG:Ce powder is scarcely excited by light in the vicinity of 410 nm corresponding to violet light and does not emit yellow light. Furthermore, the intensity in the vicinity of 340 nm of the excitation spectrum is also weak. In this way, the ceramic composite material is different from the powder material obtained by merely mixing YAG:Ce phosphor and $Al_2O_3$.

Figure 3:
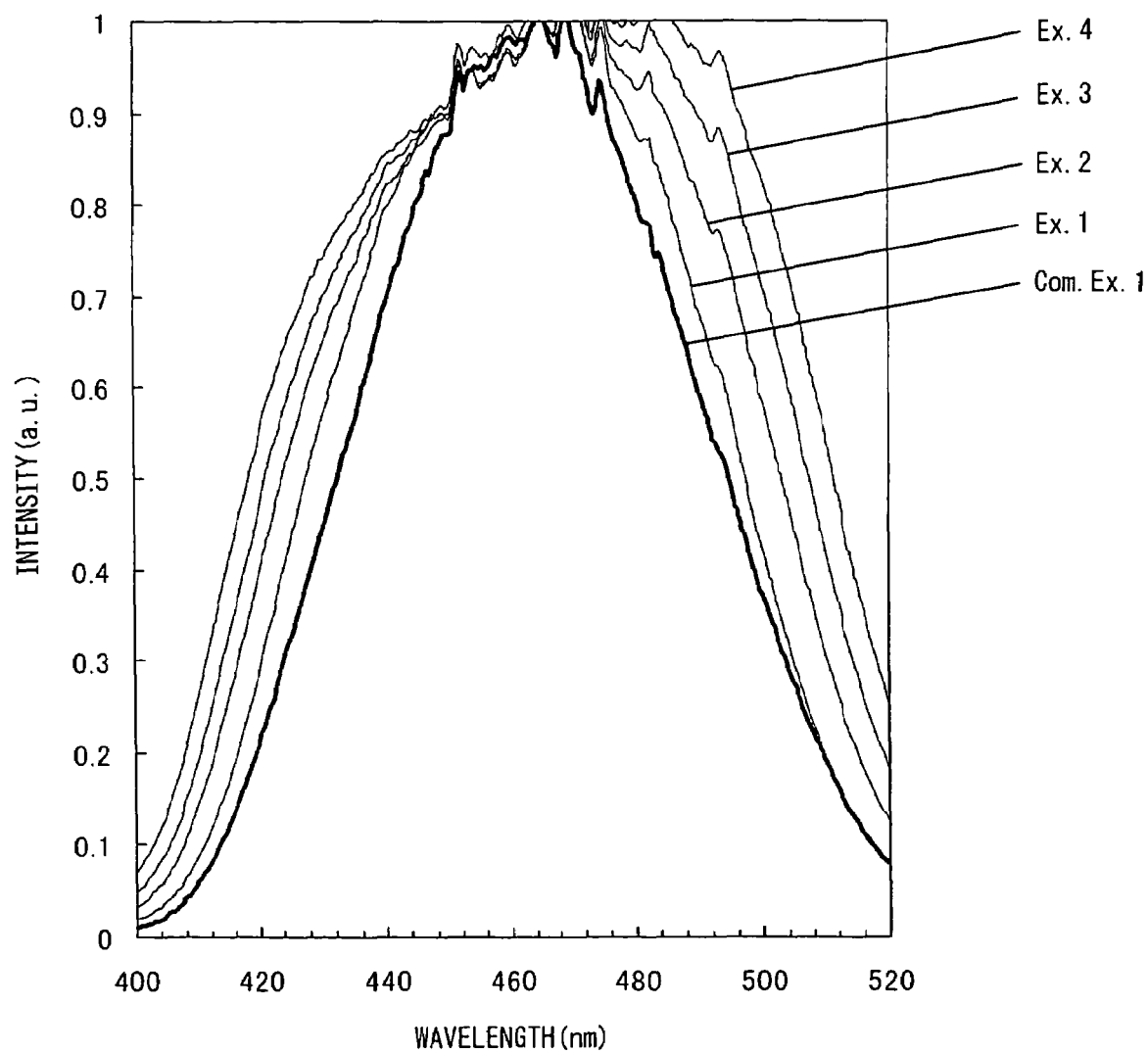
FIG. 3 is a normalized spectrum comparison view where the maximum peak value at 400 to 520 nm in the excitation spectrum with respect to 530 nm of the ceramic composite materials obtained in Examples and Comparative Example.

The difference is described below. A large difference is the peak profile in the vicinity of 460 nm which is important for a white-light light emitting element containing YAG:Ce phosphor. The excitation intensity measured varies depending on the amount of Ce or the depth which the light reached from the surface. Accordingly, in considering the mechanism of photo-luminescence, the important matter is not the excitation intensity but the similarity of peak shape. For comparing the peak shape in a unified manner, the peak height was standardized as 1 by dividing each measured value by the maximum peak value at 400 to 520 nm of each sample. FIG. 3 shows the results. In FIG. 3, the difference in the broadening of respective peaks can be compared in a unified manner. As is apparent from the comparison, the peak broadening can be confirmed in the case of the ceramic composite material as compared with the powder. The peak width at half height of each peak was determined from this figure. The results are shown in Table 2. The peak width at half height of the phosphor powder of Comparative Example 1 was 63 nm, and the peak width at half height of the ceramic composite material of the present invention was from 69 to 93 nm. This is considered to be because, as described above, the crystal field in the vicinity of Ce in the ceramic composite material is strained. As seen from these peak profiles, the phosphor powder has an optimal excitation wavelength in the region of approximately from 450 to 470 nm, whereas in the case of the ceramic composite material, when the Ce concentration is high, the optimal wavelength can be approximately from 440 to 490 nm. Furthermore, by virtue of the peak broadening, excitation can be effected over the region of 400 to 530 nm with higher efficiency than in the powder. This means that when the ceramic composite material is used, a light emitting diode can be fabricated by using violet excitation light. When such a light emitting diode can be fabricated, the blue-tinted white light, with respect to the conventional white-light light emitting diode using a YAG phosphor powder, can be improved because the violet is in a completely complementary color relationship with the photoluminescent color of the ceramic composite material.

Figure 4:
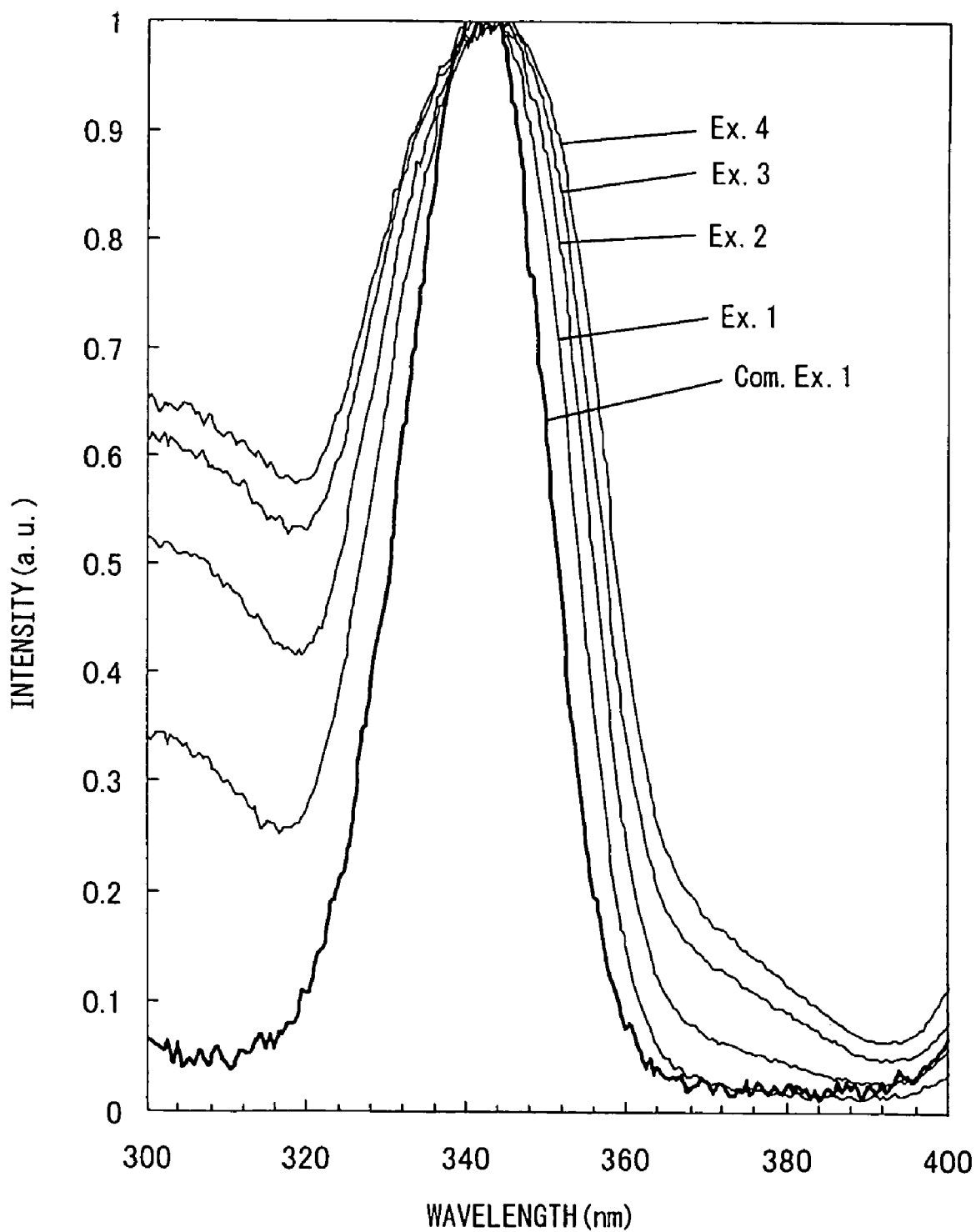
FIG. 4 is a normalized spectrum comparison view where the maximum peak value in the vicinity of 340 nm in the excitation spectrum with respect to 530 nm of the ceramic composite materials obtained in Examples and Comparative Example.

Next, the same comparison is performed on the peak in the vicinity of 340 nm of ultraviolet light by using FIG. 2. The excitation behavior of ultraviolet light is different from that of the phosphor powder. That is, the excitation intensity of the phosphor powder of Comparative Example 1 is very low. This reveals that in the ultraviolet region, the number of excitable levels of the ceramic composite material is larger than the number of excitable levels of the phosphor powder. Such a phenomenon may be affected not only by the difference in the crystal field of Ce but also by the level at the interface of the ceramic composite material. In this way, the entire structure of the ceramic composite material is considered to bring out the characteristics substantially unachievable only by $Y_3Al_5O_{12}$:Ce. FIG. 4 shows the results of the above-described normalization of peaks. Also, in this Figure, a similar broadening can be confirmed. The peak width at half height of the peak in the vicinity of 340 nm is shown in Table 2.

Furthermore, as shown in FIG. 2, in the case of the ceramic composite material, broad light emission starts on the shorter wavelength side than 400 nm. This light emission is thought to differ from the normal light emission occurring as a result of the transition of Ce from the d orbital to the f orbital. This is thought to be light emission involving Ce and the interface between $Al_2O_3$ phase and $Y_3Al_5O_{12}$:Ce phase. Such broad light emission cannot be observed in the case of powder and this phenomenon is peculiar to the ceramic composite material for light conversion.

As described in the foregoing pages, the light emission behavior of $Y_3Al_5O_{12}$:Ce in the ceramic composite material is utterly different from that of YAG:Ce. The behavior of $Y_3Al_5O_{12}$:Ce in the ceramic composite material for light conversion is a phenomenon occurring for the first time when the periphery thereof is surrounded by an $Al_2O_3$ phase in such a manner that atomic bonding is three-dimensionally formed. Thus, it can be understood that this ceramic composite material is completely different from the conventional YAG:Ce phosphor.

Example 5

Figure 7:
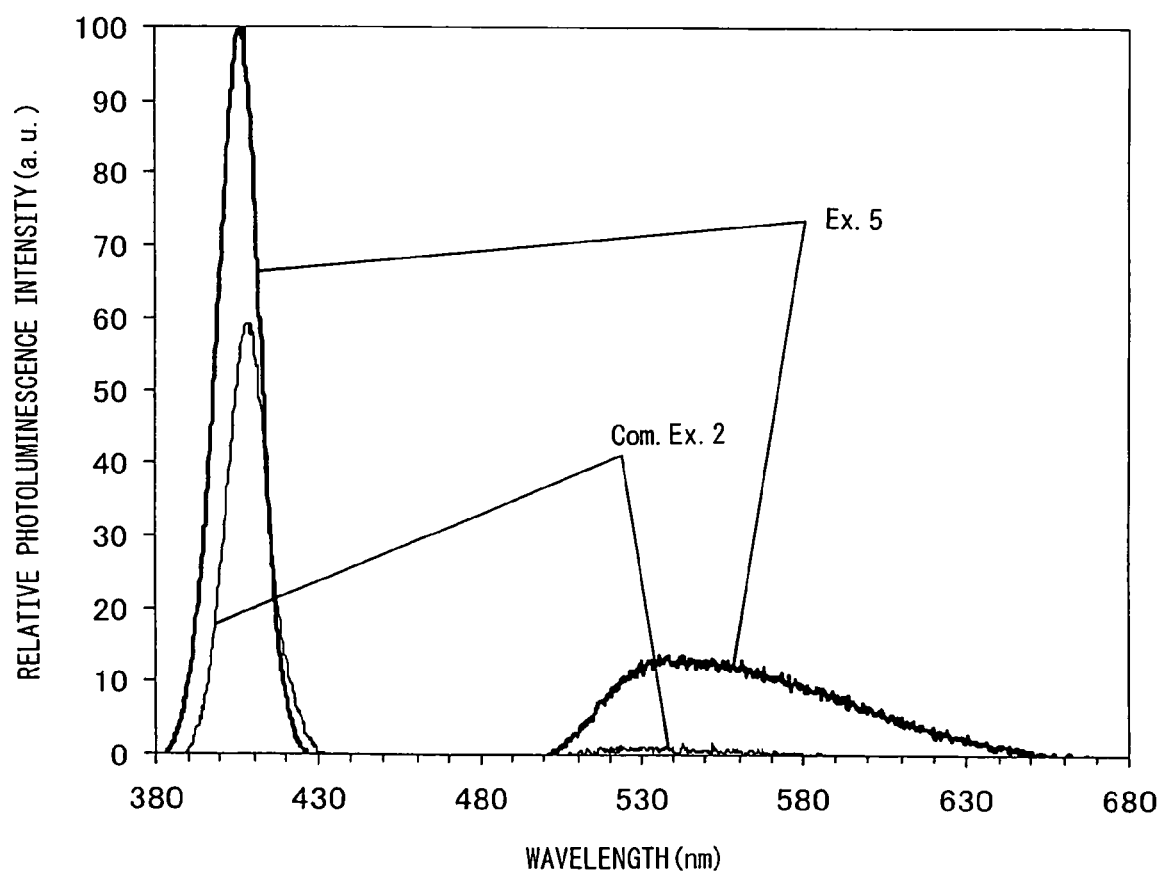
FIG. 7 is light emission spectra obtained by the white-light light emitting diode devices of Example 5 and Comparative Example 2.

The ceramic composite material of Example 2 was cut out to various thicknesses and by using a commercially available violet-light light emitting diode chip of 410 nm, a white-light light emitting diode device was produced. FIGS. 5A and 5B are a schematic views of fabricated light emitting diode devices. In FIGS. 5A and 5B, a 1a and 1b are ceramic composite materials for light conversion, 2 is a container, 3 is a gold wire, 4 is a light emitting element, 5 is a table with electrodes, and 6 is an electrode. The color of the light emitting diode was changed according to the thickness of the ceramic composite material for light conversion. The color coordinates of the obtained light emitting diode are shown in FIG. 6. In FIG. 6, the square indicates the position at x=0.33 and y=0.33 and this is a white position. It is seen that by using an excitation source of 410 nm, a good white-light light emitting diode device can be fabricated. In FIG. 6, the line connecting the color coordinates of the YAG:Ce phosphor powder excited by light of 460 nm and the color coordinates of the light source of 460 nm is shown together by a dotted line. As seen from this, in the case of blue-light light emitting diode excitation using a normal YAG:Ce phosphor powder, the mixed color is positioned on the green side rather than the white side and a good white color is not produced. FIG. 7 shows the light emission spectrum of this Example. In FIG. 7, the light emission spectrum of the light emitting diode using a YAG:Ce powder described in Comparative Example 2 is shown together. The light emitting diode of Comparative Example 2 could hardly provide yellow light, and this was a light emitting diode having a strong violet color intensity. The brightness (light flux) of the light emitting diode device was compared between Example 5 and Comparative Example 2, as a result, the brightness of the light emitting diode device of Example 5 was about 7 times higher. In this way, it was revealed that the YAG:Ce in the ceramic composite material of this Example exhibits properties utterly different from the normal YAG:Ce powder and since violet light can be utilized, a good white-light light emitting diode device can be fabricated.

Comparative Example 2

40 Parts by weight of the Ce-activated YAG powder obtained in Comparative Example 1 was kneaded with 100 parts by weight of an epoxy resin, and the resin was cured at 120° C. for 1 hour and at 150° C. for 4 hours to obtain a powder compact. This was processed into a disc shape and a light emitting diode device shown in FIG. 5A was produced. Various light emitting diode devices changed in the thickness of the disc were produced, and the light emission spectrum of each light emitting diode device was measured. As a result, with the same thickness as in Example 5, a chromaticity close to violet of the excitation light was obtained. When an extremely thick disc was used, violet-tinted white was obtained, but this was a very dark-light light emitting diode device and unusable in practice.

TABLE 2

|  | Position of 450 nm Peak Width at Half Height D (nm) | Position of 340 nm Peak Width at Half Height D (nm) |
| --- | --- | --- |
| Example 1 | 69 | 27 |
| Example 2 | 79 | 32 |
| Example 3 | 86 | 38 |
| Example 4 | 93 | 40 |
| Comparative Example 1 | 63 | 21 |

INDUSTRIAL APPLICABILITY

The white-light light emitting diode device can be used in a display, as lighting, as a backlight source or the like and is useful in industry.

The invention claimed is:

1. A white-light light emitting diode device comprising an inorganic UV light emitting diode element and a light conversion element of a ceramic composite material, wherein said inorganic UV light emitting diode element emits violet light with a peak wavelength in a range of 400 to 419 nm; said light conversion element is a solidified body in which a cerium-activated $Y_3Al_5O_{12}$ ($Y_3Al_5O_{12}$:Ce) crystal and an α-type aluminum oxide ($Al_2O_3$) crystal are continuously and three-dimensionally entangled with each other, the solidified body being free from a grain boundary phase and having a uniform texture without air bubbles or voids, the cerium-activated $Y_3Al_5O_{12}$ ($Y_3Al_5O_{12}$:Ce) crystal having a photoluminescent property of wavelength-converting a part of said violet light to yellow light, the α-type aluminum oxide ($Al_2O_3$) crystal transmitting said violet light; and the violet light being transmitted through said light conversion element and the yellow light resulting from wavelength conversion by said light conversion element are mixed to emit pseudo-white light having a first emission peak in a range of 400 to 419 nm and a first maximum photoluminescence intensity, a second emission peak in a range of 500 to 650 nm and a second maximum photoluminescence intensity, and in a CIE chromaticity coordinate region surrounded by (0.29, 0.2), (0.48, 0.41), (0.415, 0.445) and (0.26, 0.275) in terms of (x, y), the thickness of the light conversion element being from 0.2 to 1.3 mm.

2. The white-light light emitting diode device as claimed in claim 1, wherein said ceramic composite material is obtained by a unidirectional solidification method.

3. The white-light light emitting diode device as claimed in claim 1, wherein the cerium-activated $Y_3Al_5O_{12}$ is represented by the formula: $(Y_{1-x}Ce_x)_3Al_5O_{12}$ wherein x in the formula is in the range from 0.01 to 0.2.

4. The white-light light emitting diode device as claimed in claim 1, wherein the excitation spectrum corresponding to the photoluminescence at 530 nm of said ceramic composite material has a peak in the region of 400 to 520 nm and the peak width at half height of said peak is 65 nm or more.

5. The white-light light emitting diode device as claimed in claim 1, wherein said ceramic composite material has a plate-like shape.

6. The white-light light emitting diode device as claimed in claim 1, wherein said ceramic composite material has a block-like shape.

* * * * *